United States Patent [19]
Nomura et al.

[11] Patent Number: 5,508,965
[45] Date of Patent: Apr. 16, 1996

[54] SEMICONDUCTOR MEMORY DEVICE

[75] Inventors: Hidenori Nomura; Kenji Nagai; Masami Nakashima, all of Kasugai; Hiroshi Yamamoto; Isaya Sobue, both of Tanabe, all of Japan

[73] Assignees: Fujitsu Limited, Kawasaki; Fujitsu VLSI Limited, Kasugai, both of Japan

[21] Appl. No.: 305,722

[22] Filed: Sep. 14, 1994

[30] Foreign Application Priority Data

Sep. 14, 1993 [JP] Japan ................................ 5-229224
Sep. 14, 1993 [JP] Japan ................................ 5-229225

[51] Int. Cl.$^6$ ........................................... G11C 7/02
[52] U.S. Cl. ............................. 365/206; 365/208
[58] Field of Search ................................ 365/206, 222, 365/207, 208, 149

[56] References Cited

U.S. PATENT DOCUMENTS 4,661,928  4/1987  Yasuoka ............................ 365/206
4,943,949  7/1990  Yamaguchi et al. ............... 365/206
5,280,453  1/1994  Miyawaki et al. ................. 365/206

*Primary Examiner*—Tan T. Nguyen
*Attorney, Agent, or Firm*—Nikaido, Marmelstein, Murray & Oram

[57] ABSTRACT

A semiconductor memory device is disclosed, which is supplied with power from a power supply and which includes memory cells and a sense amplifier connected to the cells via bit lines. The memory device further includes a circuit for enabling the sense amplifier in response to a supplied enable signal, and for allowing the sense amplifier to rewrite cell data, read on the bit lines, into the memory cell again in self-refresh mode. The enabling circuit incorporates a noise suppression circuit which suppresses rapid changes in an operation current flowing between the power supply and the sense amplifier in order to minimize power supply related noise.

5 Claims, 10 Drawing Sheets

SEMICONDUCTOR MEMORY DEVICE

BACKGROUND OF THE INVENTION

1. Field of the Invention

The present invention relates to a semiconductor memory device with a large memory capacity, and, more particularly, to a semiconductor memory device having an improved noise suppressing design.

2. Description of the Related Art

As the memory capacity of conventional semiconductor memory devices increase, the number of internal circuits operating simultaneously in write mode, read mode and cell-data self-refresh mode likewise increase. Unfortunately, accompanying the increased memory capacity of such devices is an increase in the level of noise or interference created by the power supplied to the semiconductor's internal circuits. Consequently, with large capacity semiconductor memory devices, it is necessary to incorporate circuits in the semiconductor that suppress power supply related noise.

FIG. 1 shows the general structure of an ordinary DRAM. Control signals /RAS (Row Address Strobe) and /CAS (Column Address Strobe), input from an external device (not shown) and supplied to an address buffer 1, control the operation of the DRAM. In particular, the control signal /RAS is input to the address buffer 1 as a signal to latch the row address, while the control signal /CAS is input to the address buffer 1 as a signal to latch the column address. Both of the control signals /RAS and /CAS are input to an I/O buffer 2: /RAS as an enable signal and /CAS as an I/O control signal. Both signals /RAS and /CAS are also input to a write clock generator 3: /RAS as an enable signal and /CAS as a signal to latch a write enable signal /WE.

Based on the control signals /RAS and /CAS, address signals A0 to A9 input to the address buffer 1 are latched in the address buffer 1 and are output therefrom to a row decoder 4 and a column decoder 5. Based on the address signals A0 to A9, the row decoder 4 and column decoder 5 select specific memory cells from among a plurality of memory cells in a memory cell array 6. In cell-data read mode, cell data read from the selected memory cells are output as output data, Dout, via a sense amplifier, I/O gate 7 and the I/O buffer circuit 2. In data write mode, write data, Din, input to the I/O buffer circuit 2, is written in the selected memory cells in the memory cell array 6 via the sense amplifier and I/O gate 7. The I/O buffer circuit 2 is controlled based on a write enable signal /WE, which is input via the write clock generator 3 to the I/O buffer circuit 2, and the aforementioned control signals /RAS and /CAS.

The DRAM further includes a self-refresh controller 8, which generates row and column address signals during self-refresh mode operations and outputs the address signals to the respective row decoder 4 or column decoder 5. This mode of operation is different from either write or read operations.

FIG. 2 shows the specific constitution of memory cells in the memory cell array 6 and the sense amplifier and I/O gate 7. Each of the memory cells C is connected to a word line WL and one pair of bit lines BL and /BL. When the row decoder 4 selects a word line WL and the column decoder 5 selects a specific pair of bit lines BL and /BL, it results in the selection of a particular memory cell C in the memory cell array 6. The bit lines BL and /BL are connected to a sense amplifier 9. This sense amplifier 9 comprises P channel MOS transistors Tr1 and Tr2 and N channel MOS transistors Tr3 and Tr4, and is enabled based on a high potential supply power PSG and a low potential supply power NSG.

The sense amplifier 9 is supplied with both a high potential supply voltage PSG from a power supply Vcc via the PMOS transistor Tr5 and with a low potential supply voltage NSG from the ground Vss via the NMOS transistor Tr6. An enable signal generator 20 provided in the DRAM generates a sense amplifier enable signal LE based on the control signals /CAS and/or /RAS supplied thereto. The sense amplifier enable signal LE is input to the gate of the transistor Tr6 directly and to the gate of the transistor Tr5 via an inverter 10a. That is, the transistors Tr5 and Tr6 respectively receive complementary enable signals /LE and LE.

The reading operation of this DRAM will be described with reference to FIG. 3. With the bit lines BL and /BL reset to the half Vcc, the word line WL is selected and pulled up to an H level. As a result, cell data is read from the memory cell C connected to the word line WL, and the potential of the bit line BL becomes slightly higher than the potential of the bit line /BL. When the sense amplifier enable signal LE is set high under this situation, the transistors Tr5 and Tr6 turn on, supplying the high and low potential supply voltages PSG and NSG to the sense amplifier 9. Consequently, the sense amplifier 9 is enabled, increasing the potential difference between the bit lines BL and /BL allowing cell data to be output as output data Dout via the sense amplifier and I/O gate 7 and the I/O buffer circuit 2. Next, when the potential of the selected word line WL and the sense amplifier enable signal LE are pulled low, the sense amplifier 9 becomes disabled, resetting the potentials of the bit lines BL and /BL to the same level.

In self-refresh mode of cell data, each memory cell C is periodically selected by the self-refresh controller 8. Cell data read onto the bit lines BL and /BL from the selected memory cell C is latched by the sense amplifier 9 connected to those bit lines. Based on the latched data in the sense amplifier 9, data is written in the selected memory cell C to accomplish the self-refreshing operation.

In a DRAM with a large memory capacity, numerous sense amplifiers 9 are simultaneously enabled, for example, in the aforementioned read mode. This action results in the generation of two types of power supply related noise: noise N1, which temporarily decreases the voltage level of the power supply Vcc, and noise N2, which temporarily increases the voltage level of the power supply Vss. Both are respectively indicated by the broken lines in FIG. 3. Such power supply noises N1 and N2 tend to induce circuits peripheral to the memory cell 6 to malfunction.

In a typical DRAM, a single self refreshing operation performed on a memory cell requires 1024 cycles of self refreshing over a 128 ms period. That is, each memory cell is self-refreshed at the time interval of 128 ms. If the DRAM has a memory capacity of 1M bits, about 1000 bits of memory cells are simultaneously self-refreshed per cycle, so that about 1000 sense amplifiers are simultaneously enabled. With a memory capacity of 4M bits, about 4000 bits of memory cells are simultaneously self-refreshed per cycle, so that about 4000 sense amplifiers are simultaneously enabled. This illustrates that as the memory capacity of the DRAM increases, so does the number of the sense amplifiers operating simultaneously. The larger capacity DRAMs, therefore, experience notable peak current values between the individual simultaneously operating sense amplifiers and their respective power supplies. This results in unwanted and significant power supply related noises N1 and N2.

SUMMARY OF THE INVENTION

Accordingly, it is a primary objective of the present invention to provide an integrated circuit memory device capable of suppressing the occurrence of power supply noise originated from the activation of sense amplifiers.

To achieve the foregoing and other objects and in accordance with the purpose of the present invention, an improved memory device is provided.

The integrated circuit memory device according to the present invention is supplied with power from a power supply, and comprises memory cells C for storing data written to the cells, and a sense amplifier communicatively coupled to the memory cells C via a pair of bit lines BL and /BL, as shown in FIG. 18. The memory device further comprises an enabling circuit responsive to an enable signal φ, for enabling the sense amplifier to write cell data, read on the pair of bit lines BL and /BL, into said memory cell and to rewrite the written cell data to the memory cells during a self-refresh operation. The enabling circuit incorporates a noise suppression circuit which suppresses rapid changes in the flow of current between the power supply and the sense amplifier in order to minimize power supply related noise.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

DETAILED DESCRIPTION OF THE PREFERRED EMBODIMENTS

First Embodiment

Figure 4:
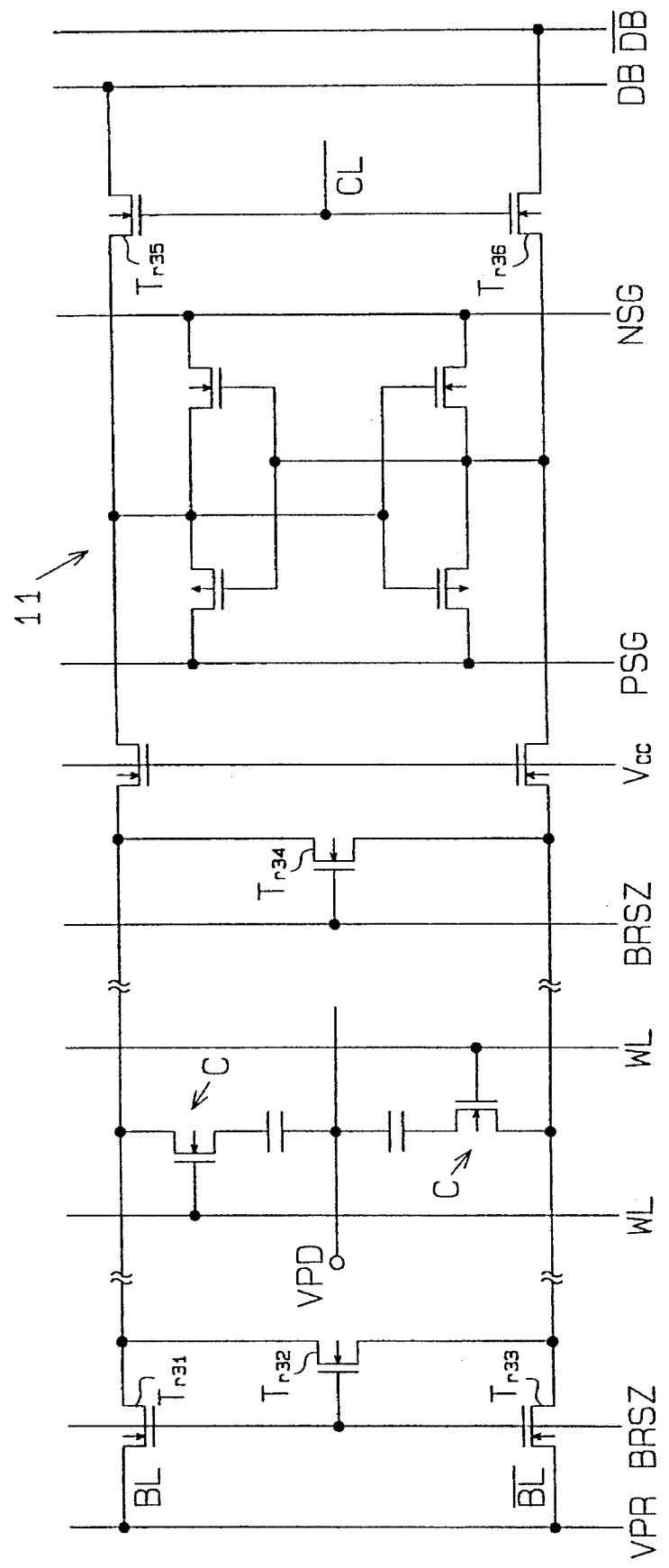
FIG. 4 is a circuit diagram showing a DRAM according to the present invention.
Figure 5:
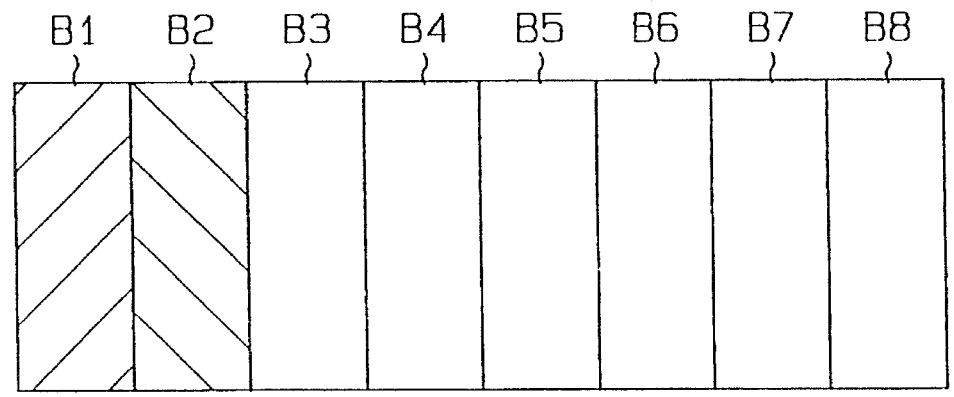
FIG. 5 is a diagram schematically showing a memory cell array according to a first embodiment of the present invention.
Figure 6A:
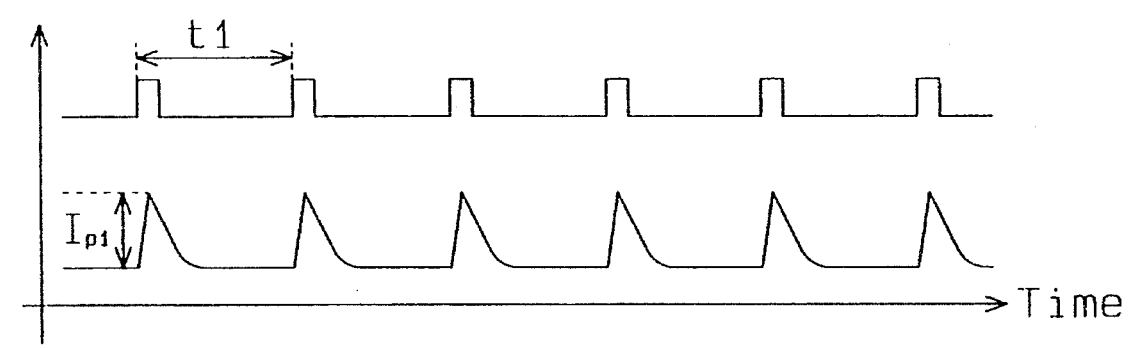
FIG. 6A is a timing waveform chart illustrating the operation of the conventional art.
Figure 6B:
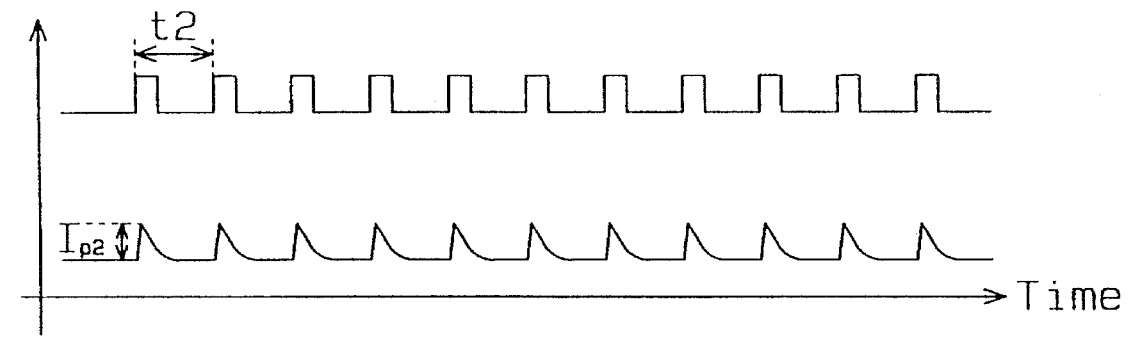
FIG. 6B is a timing waveform chart illustrating the operation of the first embodiment.

FIGS. 4, 5 and 6B illustrate a first embodiment of the present invention. As schematically shown in FIG. 5, the memory cell array of a 4-Mbit DRAM comprises eight blocks B1 to B8, each having a 512 Kbits capacity. The specific constitution of the memory cell array will be discussed below with reference to the pair of memory cells and sense amplifier shown in FIG. 4. Each memory cell array is formed having multiple pairs of bit lines BL and /BL, similar to the pair shown in FIG. 4. The array contains multiple memory cells C connected to each pair of bit lines BL and /BL. Each of these memory cells C couple to a word line WL. When a word line WL is selected by a row decoder, cell data is read out on the bit lines BL and /BL from the memory cells C connected to that word line WL.

Four N channel MOS transistors Tr31 to Tr34, connected to the bit lines BL and /BL, reset the potentials of the bit lines BL and /BL to a reset potential VPR prior to the reading operation. When a high reset signal BRSZ is input to the gates of the individual transistors Tr31 to Tr34, those transistors Tr31–Tr34 turn on and the potentials of the bit lines BL and /BL are reset to the reset potential VPR (ex. ½ of Vcc). The bit lines BL and /BL are connected to a sense amplifier 11, which is enabled based on the high and low potential supply voltages PSG and NSG in response to a sense amplifier enable signal supplied thereto. When enabled, the sense amplifier 11 amplifies and latches the cell data read on the bit lines BL and /BL.

The bit lines BL and /BL are connected to data buses DB and /DB via column gates Tr35 and Tr36, respectively. A column select signal CL is input to the column gates Tr35 and Tr36 from a column decoder. When the column select signal CL is set high, the column gates Tr35 and Tr36 turn on and the cell data amplified by the sense amplifier 11 is output to the data buses DB and /DB.

In self-refresh mode, when one word line WL is selected, cell data is read out onto the bit lines BL and /BL from the memory cell C connected to the selected word line WL, resulting in a slight potential difference between the bit lines BL and BL. Thereafter, when the sense amplifier 11 is enabled, the potential difference between the bit lines BL and /BL increases. With the increased potential difference, cell data is written into the memory cell C to accomplish the self-refreshing operation.

According to the conventional art, such self-refreshing is executed on every two blocks. According to the present invention, this is illustrated as blocks B1 and B2 as shown in FIG. 5. For example, when 4096 memory cells in the blocks B1 and B2 are selected in parallel by the self-refresh controller 8, the 4096 sense amplifiers 11 in those blocks B1 and B2 are simultaneously enabled. Respecting the conventional memory cell, the time interval t1 to complete one cycle of self-refreshing is 125 μs, as shown in FIG. 6A.

Amplitude Ip1 in FIG. 6A indicates the peak value of the current between the power supply and each sense amplifier 11 during each cycle that 4096 sense amplifiers 11 simultaneously execute data writing.

According to this embodiment, self-refreshing is executed for each of the blocks B1 to B8. For example, when 2048 memory cells C in the block B1 are selected by the self-refresh controller 8, the 2048 sense amplifiers 11 in the same block B1 are simultaneously enabled. In this case, the time interval t2 to complete one cycle of the self-refreshing operation is about 62 µs as shown in FIG. 6B. Accordingly, there are 2048 sense amplifiers 11 simultaneously functioning, where the peak value of the current in each cycle is Ip2, which is approximately a half of Ip1. Like the conventional art, all of the memory cells according to the present invention can be refreshed thoroughly in 128 ms. Unlike the conventional art, this embodiment suppresses the peak value of the current flowing between the power supply and each sense amplifier in each cycle to about a half that exhibited in the typical memory cell array. Consequently, power supply noise can be greatly reduced compared to the conventional art.

Second Embodiment

Figure 1:
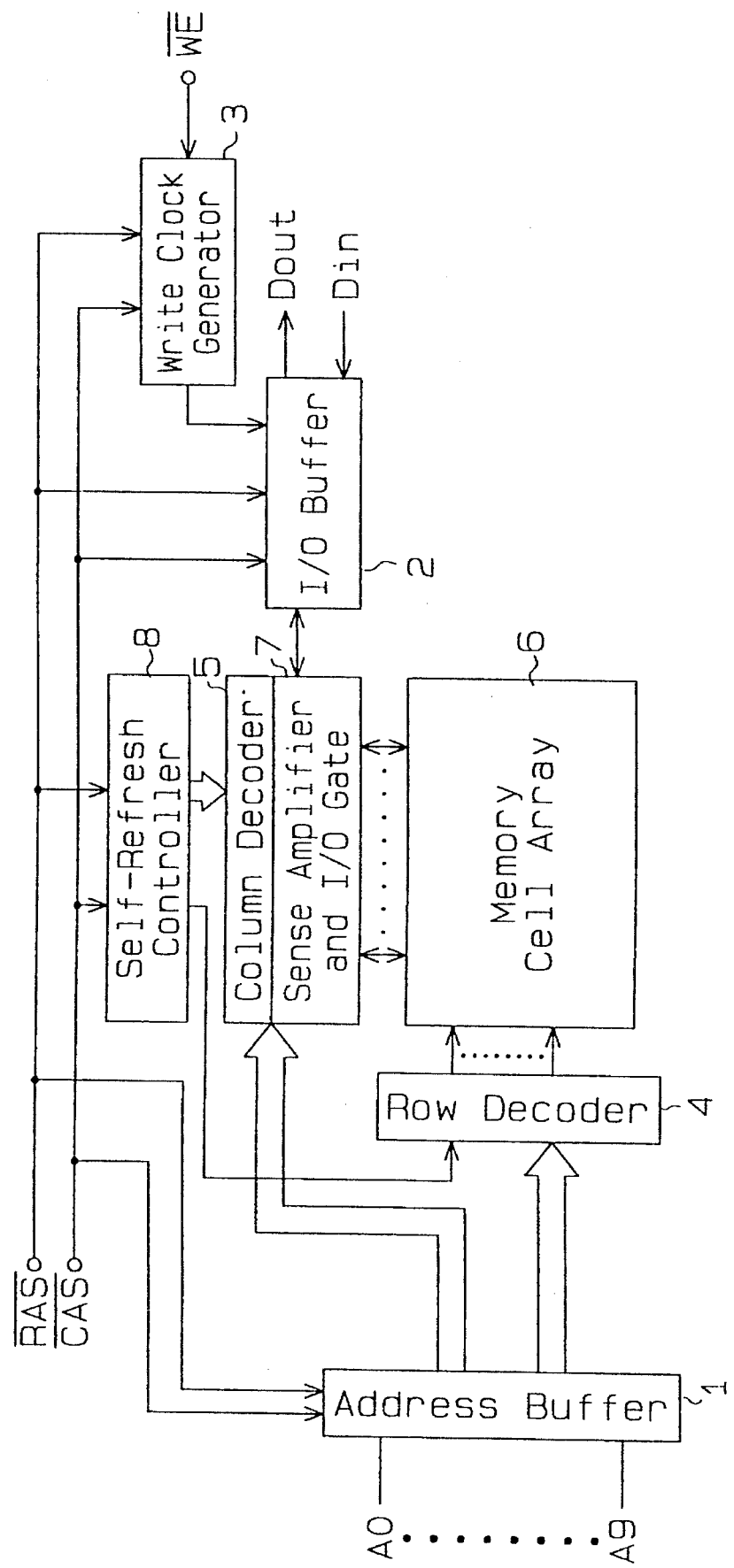
FIG. 1 is a block diagram showing the general structure of a conventional DRAM.
Figure 2:
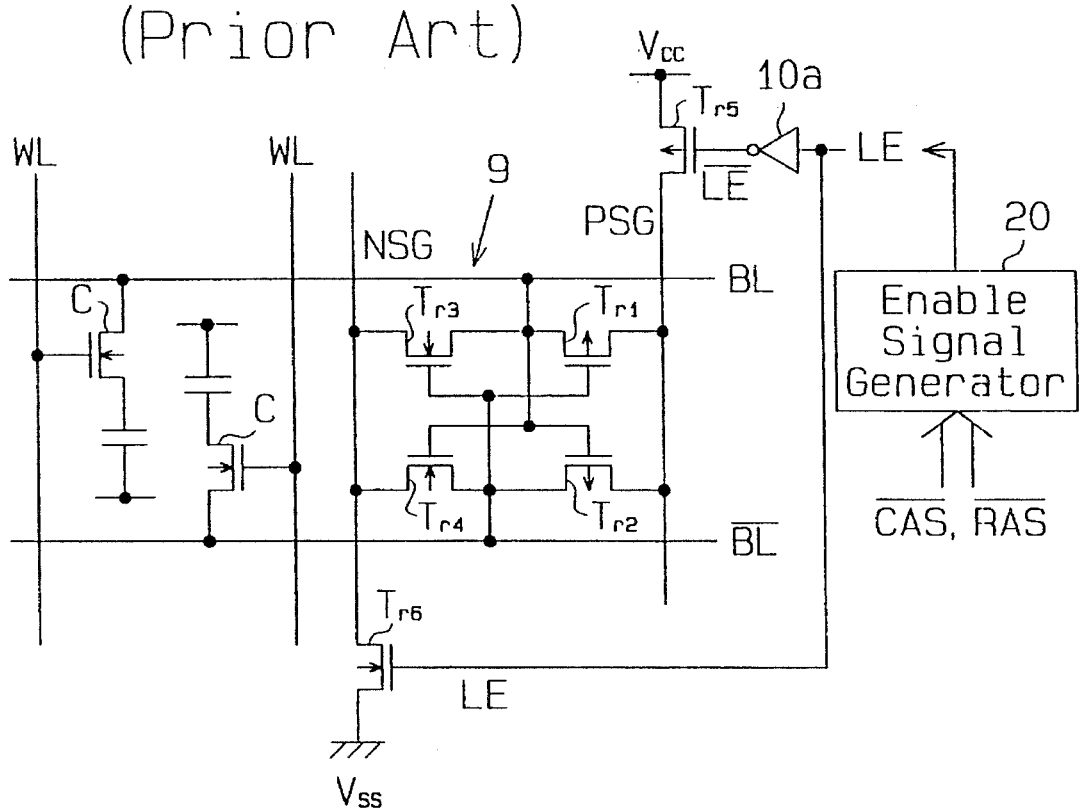
FIG. 2 is a circuit diagram showing a portion of the DRAM shown in FIG. 1.
Figure 3:
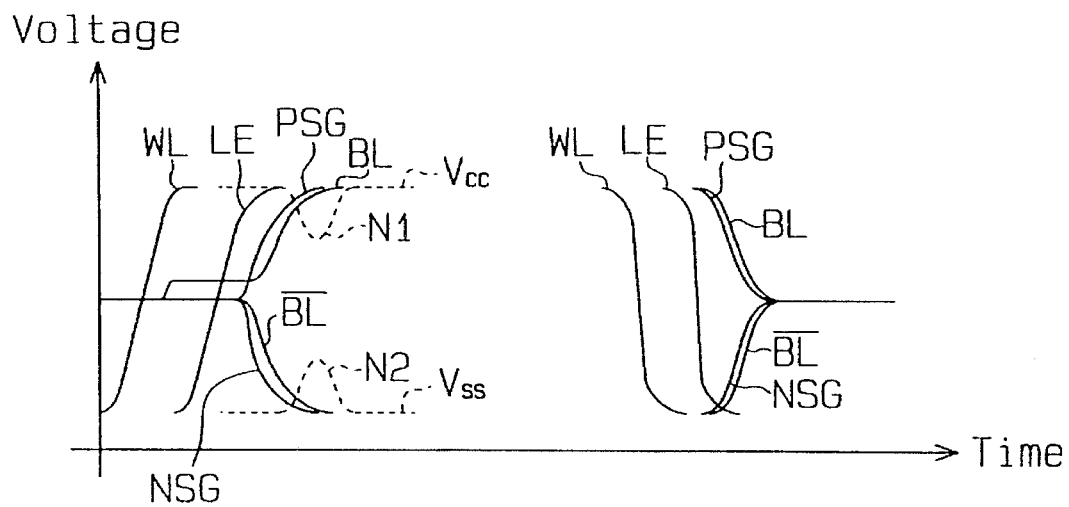
FIG. 3 is a timing waveform chart illustrating the operation of the DRAM shown in FIG. 1.

A second embodiment of the present invention will be described below with reference to FIGS. 7 to 9. Each of sense amplifiers 11 in FIG. 7 has the same structure as the sense amplifier 11 of the first embodiment. The high potential supply voltage PSG is supplied to the sense amplifiers 11 via a P channel MOS transistor Tr37 from the power supply Vcc. The low potential supply voltage NSG is supplied to the sense amplifiers 11 via an N channel MOS transistor Tr38 from the power supply Vss. Complementary enable signals $\phi s$ and $/\phi s$ from the enable signal generator 20 are respectively supplied to the gates of the transistors Tr37 and Tr38. The enable signal $/\phi s$ is equivalent to the enable signal LE in FIG. 2. The transistors Tr37 and Tr38 have a size that can supply a sufficient operational current to each sense amplifier 11.

Figure 7:
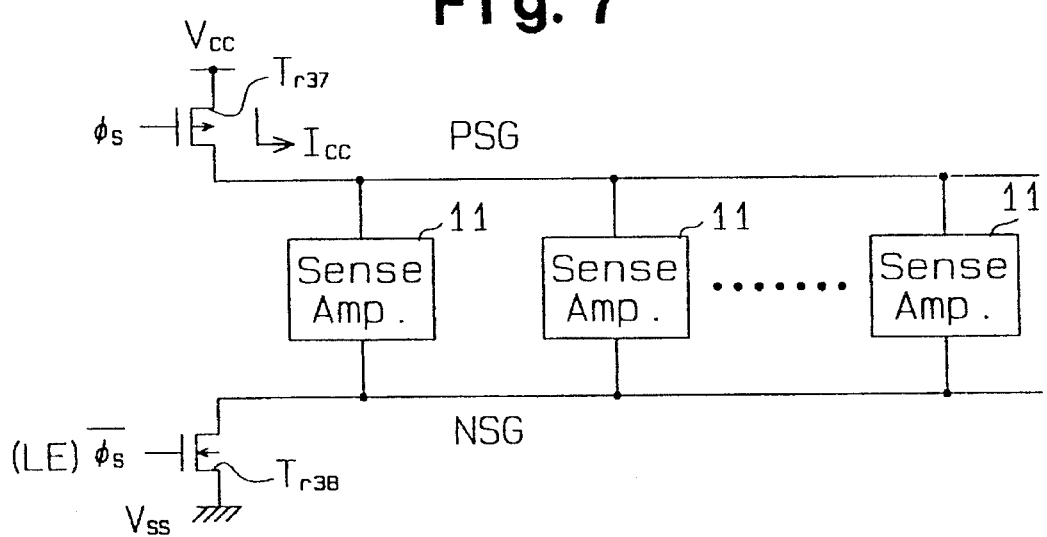
FIG. 7 is a schematic diagram of a circuit for supplying power to sense amplifiers according to a second embodiment of the present invention.
Figure 8:
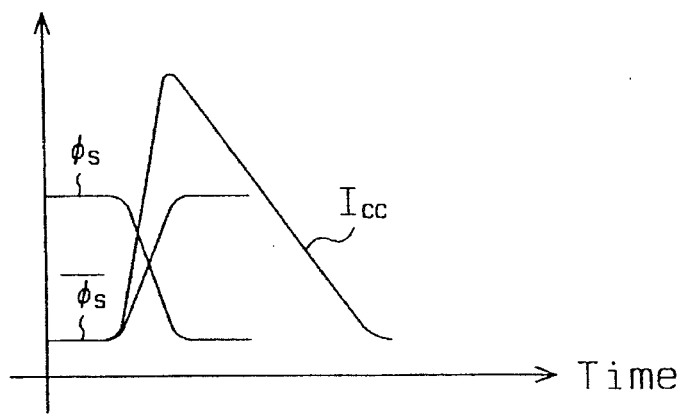
FIGS. 8 and 9 are timing waveform charts illustrating the operation of the second embodiment.
Figure 9:
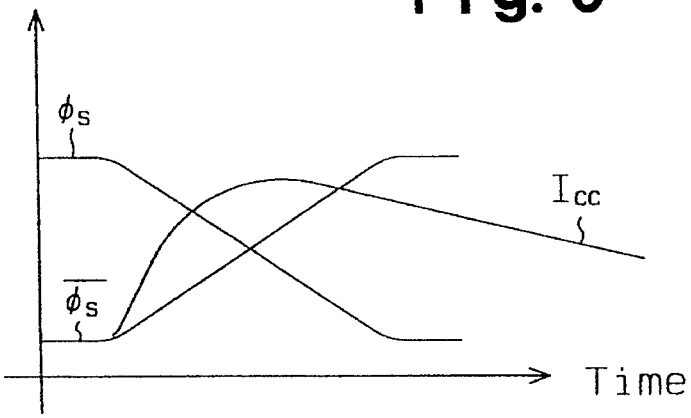

In the sense amplifier enabling circuit as shown in FIG. 7, the operational current Icc, supplied to each sense amplifier 11 from the power supply Vcc via the transistor Tr37, undergoes a sharp increase when the enable signal $\phi s$ suddenly falls low from a high potential and when the enable signal $/\phi s$ suddenly rises high from a low potential as shown in FIG. 8. This results in the generation of unwanted power supply noise. If, as in this embodiment, the fall of enable signal $\phi s$ and the rise of enable signal $/\phi s$ were gradual as shown in FIG. 9, the operational current Icc flowing through the sense amplifier 11 would also rise gradually. The present invention therefore avoids the generation of power supply related noise by controlling the rate which enable signals $\phi s$ and $/\phi s$ rise and fall.

Third Embodiment

Figure 10:
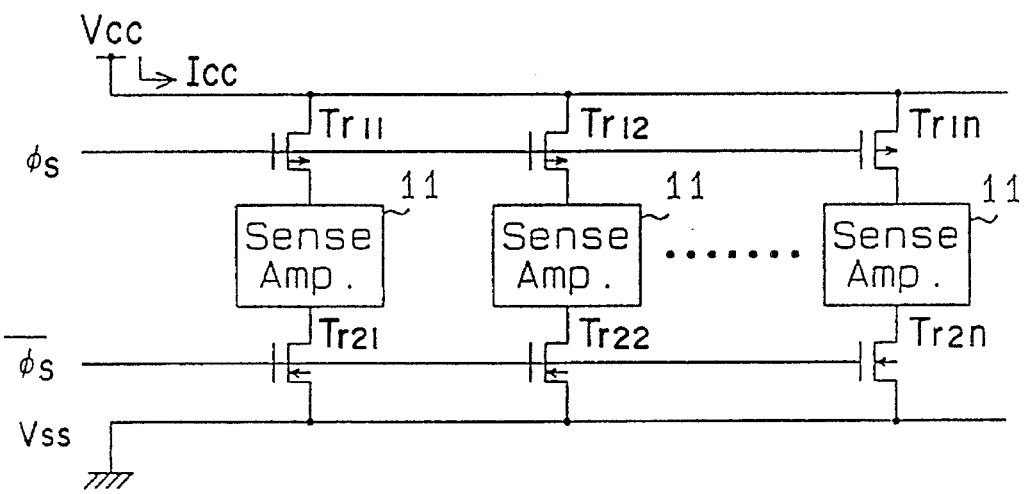
FIG. 10 is a schematic diagram of a circuit for supplying power to sense amplifiers according to a third embodiment of the present invention.

A third embodiment of the present invention will be described below with reference to FIG. 10. The high potential supply voltage PSG is supplied to multiple (n) sense amplifiers 11 via P channel MOS transistors Tr11 to Tr1n from the power supply Vcc. The enable signal $\phi s$ is input to the gates of the individual transistors Tr11–Tr1n. The low potential supply voltage NSG is supplied to the sense amplifiers 11 via N channel MOS transistor Tr21 to Tr2n from the power supply Vss. The enable signal $/\phi s$ is input to the gates of the individual transistors Tr21–Tr2n. As in the previous embodiment, with the sense amplifier enabling circuit as shown in FIG. 10, if the enable signal $\phi s$ undergoes a gradual fall or rise like that illustrated in FIG. 9, the operational current Icc also undergoes a gradual rise. According to this embodiment, therefore, it is also possible to suppress the occurrence of power supply noise.

Fourth Embodiment

A fourth embodiment of the present invention will be described below with reference to FIG. 11. The high potential supply voltage PSG is supplied to each sense amplifier 11 via two parallel P channel MOS transistors Tr1A and Tr1B from the power supply Vcc. An enable signal $\phi sa$ from the enable signal generator 20 is input to the gate of the transistor Tr1A. An enable signal $\phi sb$, which is produced by the self-refresh controller 8 based on the control signals /RAS and/or /CAS, is input to the gate of the transistor Tr1B. The size of the transistor Tr1B is greater than that of the transistor Tr1A. The low potential supply voltage NSG is supplied to each sense amplifier 11 via two parallel N channel MOS transistors Tr2A and Tr2B from the power supply Vss. An enable signal $/\phi sa$ from the enable signal generator 20 is input to the gate of the transistor Tr2A. An enable signal $/\phi sb$ from the self-refresh controller 8 is input to the gate of the transistor Tr2B. The size of the transistor Tr2B is greater than that of the transistor Tr2A.

Figure 11:
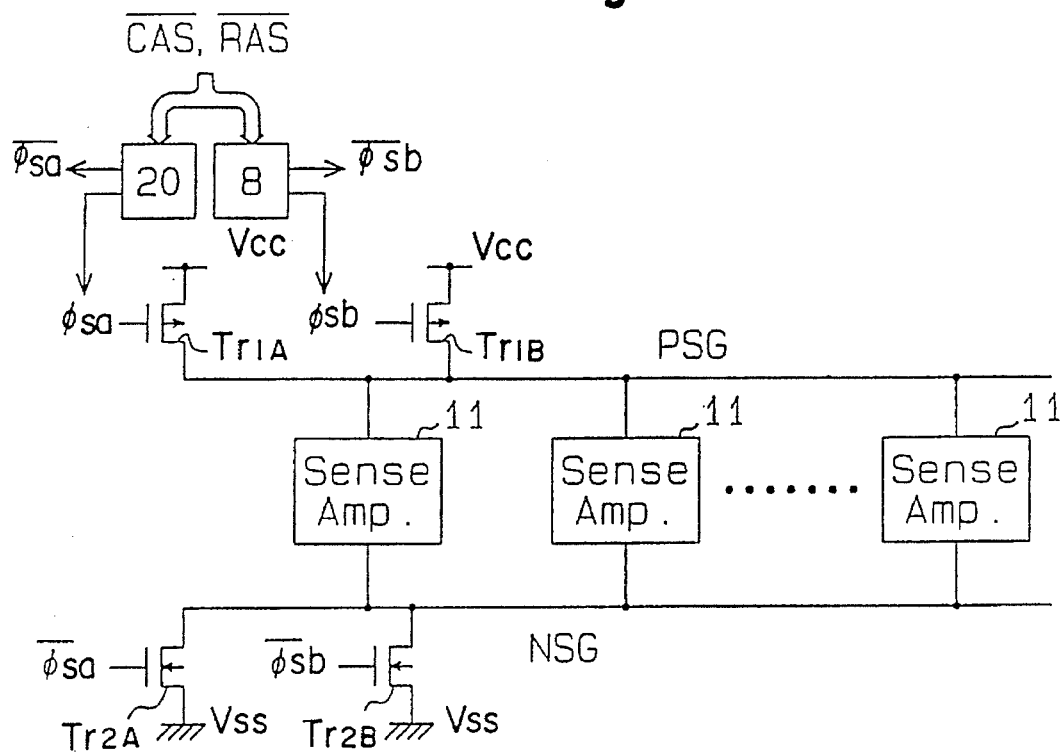
FIG. 11 is a schematic diagram of a circuit for supplying power to sense amplifiers according to a fourth embodiment of the present invention.

In the sense amplifier enabling circuit in FIG. 11, for example, when the enable signals $\phi sa$ and $\phi sb$ are set to an L level and the enable signals $/\phi sa$ and $/\phi sb$ are set to an H level in read mode, the transistors Tr1A, Tr1B, Tr2A and Tr2B turn on, supplying sufficient operation currents to the individual sense amplifiers 11. In self-refresh mode, if the enable signals $\phi sa$ and $/\phi sa$ are kept low, and if the enable signals $/\phi sa$ and $/\phi sb$ are kept high then, the transistors Tr1A and Tr2A will turn on while the transistors Tr1B and Tr2B turn off. Consequently, the high and low potential supply voltages and NSG are supplied to the individual sense amplifiers 11 via the transistors Tr1A and Tr2A, respectively. Therefore, less current will be supplied to each sense amplifier 11 in the self-refresh mode in comparison with that supplied during the read mode. This prevents the sharp rise of the operation current Icc, thereby suppressing the occurrence of power supply noise.

Fifth Embodiment

A fifth embodiment of the present invention will be described below with reference to FIG. 12. The high potential supply voltage PSG is supplied to n sense amplifiers 11 from the power supply Vcc via the P channel MOS transistors Tr11A to Tr1nA and the P channel MOS transistors Tr11B to Tr1nB. The enable signal $\phi sa$ from the enable signal generator 20 is input to the gates of the transistors Tr11A–Tr1nA, and the enable signal $\phi sb$ from the self-refresh controller 8 is input to the gates of the transistors Tr11B–Tr1nB. The sizes of the transistors Tr11B–Tr1nB are set greater than those of the associated transistors Tr11A-Tr1nA so that the transistors Tr11A-Tr1nA source less current than the transistors Tr11B-Tr1nB.

The low potential supply voltage NSG is supplied to the individual sense amplifiers 11 from the power supply Vss via N channel MOS transistors Tr21A to Tr2nA and N channel MOS transistors Tr21B to Tr2nB. The enable signal $/\phi sa$, the complement of the signal $\phi sa$, is input to the gates of the transistors Tr21A–Tr2nA, while the enable signal $/\phi sb$, the complement to the signal $\phi sb$, is input to the gates of the transistors Tr21B–Tr2nB. The sizes of the transistors Tr21B–Tr2nB are set greater than those of the associated transistors Tr21A–Tr2nA so that the transistors Tr21A–Tr2nA source less current than the transistors Tr21B–Tr2nB.

Figure 12:
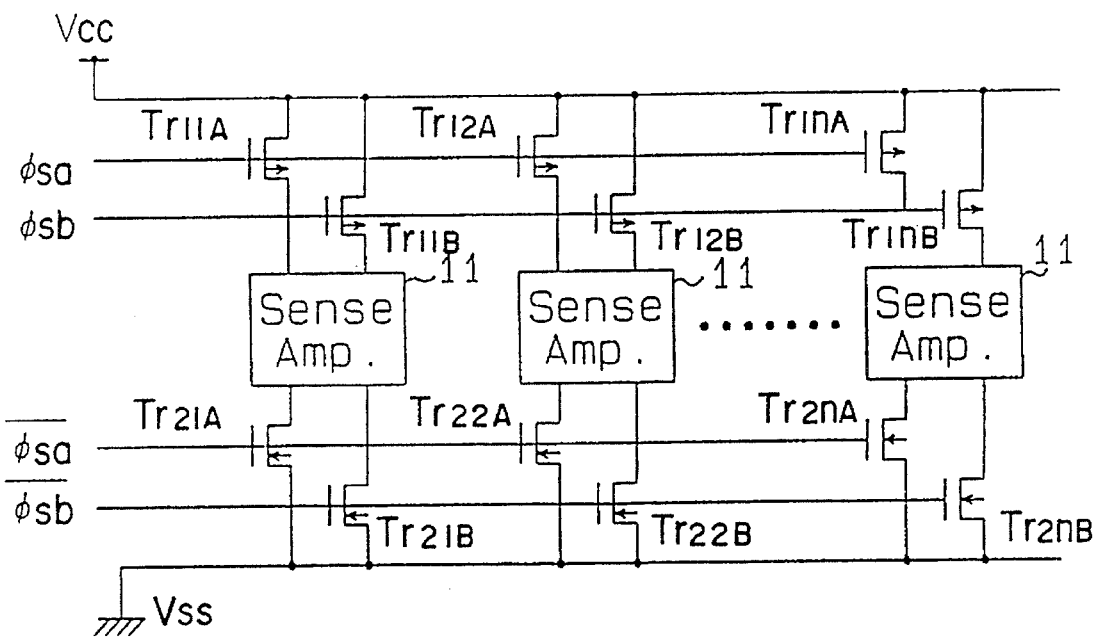
FIG. 12 is a schematic diagram of a circuit for supplying power to sense amplifiers according to a fifth embodiment of the present invention.

In the sense amplifier enabling circuit shown in FIG. 12, when the enable signals $\phi$sa and $\phi$sb are set to an L level and the enable signals /$\phi$sa and /$\phi$sb are set to an H level in read mode, all the transistors Tr11A–Tr1nA, Tr11B–Tr1nB, Tr21A–Tr2nA and Tr21B–Tr2nB turn on, supplying sufficient operation currents to the individual sense amplifiers 11. In self-refresh mode, the enable signal $\phi$sa is kept at the L level, the enable signal /$\phi$sa is kept at the H level, the enable signal $\phi$sb is kept at the H level and the enable signal /$\phi$sb is kept at the L level. Consequently, the transistors Tr11A–Tr1nA and Tr21A–Tr2nA turn on and the transistors Tr11B–Tr1nB and Tr21B–Tr2nB turn off. This allows the high and low potential supply voltages PSG and NSG to be supplied to the individual sense amplifiers 11 via the transistors Tr11A–Tr1nA and Tr21A–Tr2nA, respectively. Therefore, the amount of the current supplied to each sense amplifier 11 in self-refresh mode is restricted as compared with that in read mode. This prevents the sharp rise of the operation current Icc, thereby suppressing the occurrence of power supply noise.

Sixth Embodiment

Figure 13:
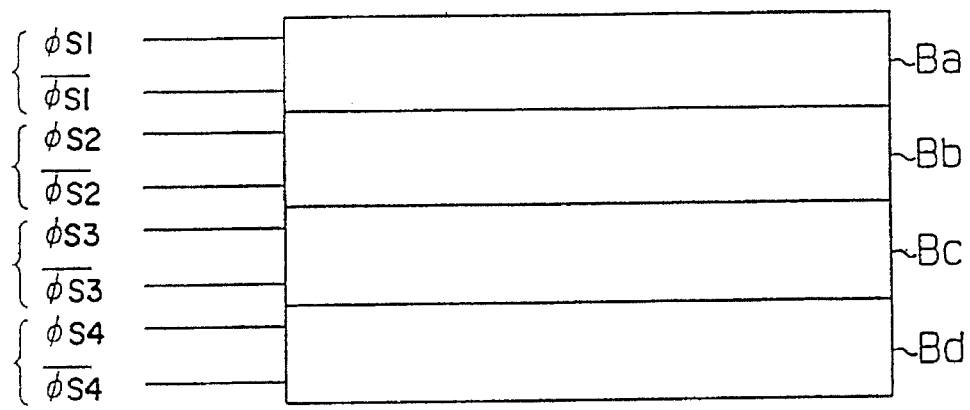
FIG. 13 is an explanatory diagram of a memory cell array illustrating a sixth embodiment of the present invention.

FIG. 13 shows a memory cell array according to a sixth embodiment of this invention. A 1-Mbit memory cell array 6 is separated into a plurality of blocks Ba to Bd (four blocks in this embodiment). Sense amplifiers, belonging to the respective blocks Ba-Bd, are driven by complementary enable signal pairs ($\phi$s1, /$\phi$s1) to ($\phi$s4, /$\phi$s4), respectively. In self-refresh mode, time delays are given to the input timings for the enable signal pairs ($\phi$s1, /$\phi$s1) to ($\phi$s4, /$\phi$s4) to sequentially enable the sense amplifiers of the individual blocks Ba–Bd. This design prevents the operation currents from rapidly rising due to the overlapping of the operation currents of the plurality of sense amplifiers, thus suppressing the occurrence of power supply noise.

Seventh Embodiment

Figure 14:
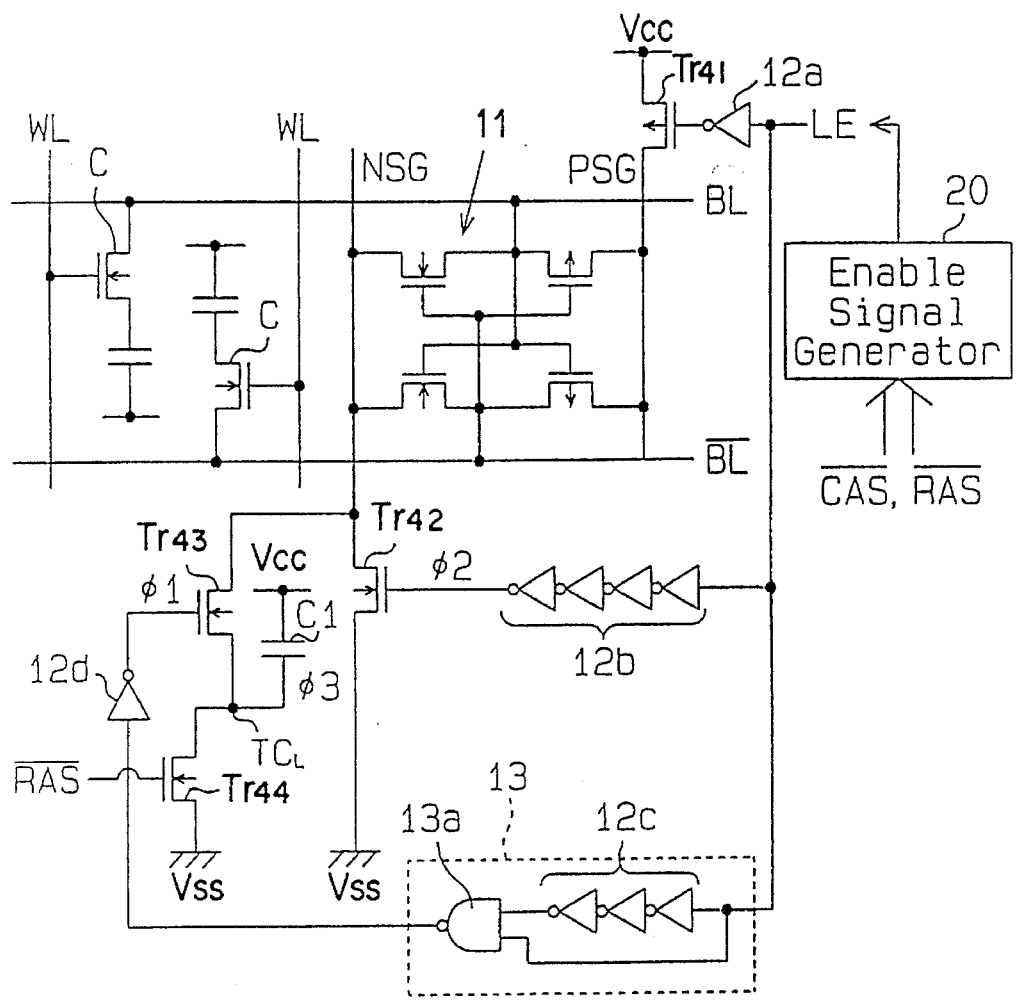
FIG. 14 is a schematic diagram of a circuit for supplying power to sense amplifiers according to a seventh embodiment of the present invention.

FIG. 14 shows a seventh embodiment of this invention. A transistor Tr42, which supplies the low potential supply voltage NSG to the sense amplifier 11, has a gate connected via even-numbered stages of inverters 12b to the enable signal generator 20 which generates the sense amplifier enable signal LE. Therefore, the enable signal LE is input as an output signal $\phi$2 to the gate of the transistor Tr42 following the propagation delay inherent to the inverters 12b.

The sense amplifier enabling circuit in FIG. 14 includes a one-shot pulse generator 13 which has odd-numbered stages of inverters 12c and a NAND gate 13a. The enable signal LE is also input to the one-shot pulse generator 13. When a rising input signal LE is input to the one-short pulse generator, the one-shot pulse generator 13 outputs an L-level pulse signal for a given time. The pulse width of the L-level output is determined by the odd-numbered stages of inverters 12c, and is set to match the delay time of the inverters 12b.

The output signal of the one-shot pulse generator 13 is input to an inverter 12d whose output signal $\phi$1 is input to the gate of an N channel MOS transistor Tr43. The transistor Tr43 has a drain connected to the drain of the transistor Tr42 and a source connected to the high potential power supply Vcc via a capacitor C1. The low potential end $TC_L$ of the capacitor C1 is connected to the drain of an N channel MOS transistor Tr44. This transistor Tr44 has a source connected to the grounded power supply Vss and a gate which receives the control signal /RAS.

Figure 15:
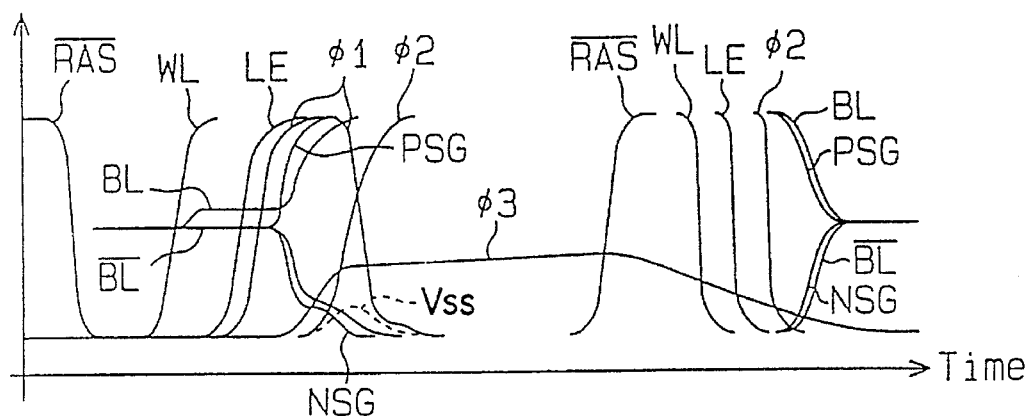
FIG. 15 is a timing waveform chart illustrating the operation of the seventh embodiment.

The reading operation of the DRAM according to this embodiment will be described below with reference to FIG. 15. Prior to reading operation, with the control signal /RAS at an H level, the transistor Tr44 is turned on. Accordingly, the potential level, $\phi$3, of the low potential end of capacitor C1, $TC_L$, equals the level of the supply voltage Vss.

Next, when the control signal /RAS falls to an L level, the transistor Tr44 is turned off. When the associated word line WL is selected, a slight potential difference occurs between the bit lines BL and /BL. When the sense amplifier enable signal LE goes high, a transistor Tr41 turns on and the high potential supply voltage PSG of the sense amplifier 11 goes high.

Further, the one-shot pulse generator 13 forces the output signal $\phi$1 of the inverter 12d high, temporarily turning on the transistor Tr43. Consequently, the low potential supply voltage NSG enables the sense amplifier 11 with a power level matching power supply Vss, based on the potential level $\phi$3 at the low potential end $TC_L$ of the capacitor C1. The sense amplifier 11, at this time, increases the potential level $\phi$3 of the low potential end $TC_L$ of the capacitor C1.

Even when the one-shot pulse generator 13 causes the output signal $\phi$1 of the inverter 12d to fall thereby turning off the transistor Tr43, the output signal $\phi$2 of the delay circuit 12b rises, turning on the transistor Tr42. As a result, the low potential supply voltage NSG of the level of the power supply Vss is kept supplied to the sense amplifier 11, so that the active state of the sense amplifier 11 continues. As the activation of the sense amplifier 11 is maintained, the potential difference between the bit lines BL and /BL becomes greater.

Next, when the control signal /RAS rises to a high potential, the transistor Tr44 turns on and the level $\phi$3 at the low potential end TCL falls to ground GND. When the word line WL goes low terminating the selection of the memory cell C and when the sense amplifier enable signal LE falls low, the levels of the high and low potential supply voltages PSG and NSG of the sense amplifier 11 become equal to each other. This consequently disables the sense amplifier 11 and resets the potentials of the bit lines BL and /BL.

According to the DRAM of this embodiment, as apparent from the above, when the sense amplifier enable signal LE goes high and enables the sense amplifier 11, the low potential supply voltage NSG of the sense amplifier 11 first settles at the $\phi$3 level, the low potential end $TC_L$ of the capacitor C1, allowing the capacitor C1 to accumulate the charges from the sense amplifier 11. Thereafter, the low potential power supply NSG is connected to the power supply Vss, allowing the power supply Vss to accumulate the charges from the sense amplifier 11. Thus, despite the simultaneous enablement of many sense amplifiers 11 during the self-refresh read modes as described according to the present embodiment, it is possible to prevent the drastic flow of the charges to the power supply Vss from each sense amplifier 11. This suppresses the occurrence of power supply noise caused by the rising of the potential level of the power supply Vss.

Moreover, the discharge of the capacitor C1 is executed in synchronism with the rising of the control signal /RAS, after the potential difference between the bit lines BL and /BL is increased by the action of the sense amplifier 11. It is therefore possible to reduce the effects which the discharge of capacitor C1 has on variations in the voltage of the power supply Vss.

Eighth Embodiment

Figure 16:
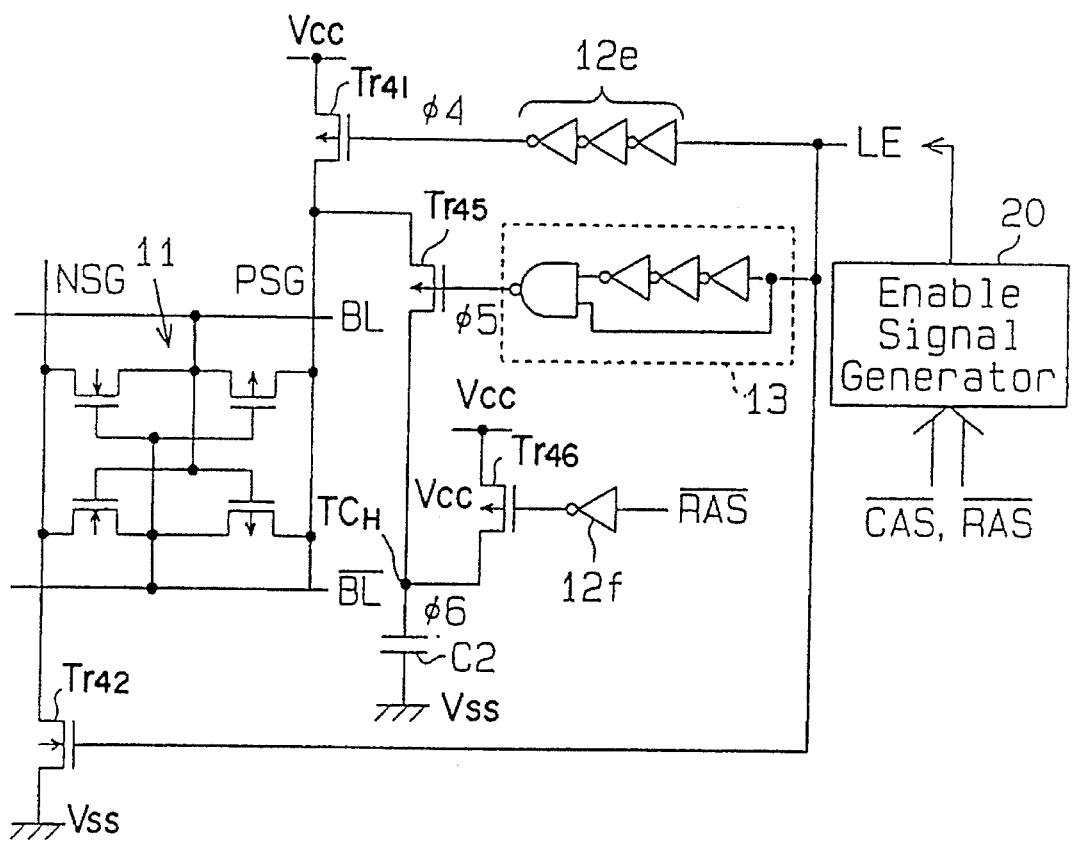
FIG. 16 is a schematic diagram of a circuit for supplying power to sense amplifiers according to an eighth embodiment of the present invention.

FIG. 16 shows an eighth embodiment of this invention. A transistor Tr41, provided between the high potential power supply Vcc and the sense amplifier 11, has a gate connected to the enable signal generator 20 via odd-numbered stages of inverters 12e. Accordingly, a signal φ4, which is the inverted sense amplifier enable signal LE, is input to the gate of the transistor Tr41 following the propagation delay inherent to the inverters 12e. This sense amplifier enabling circuit has a one-shot pulse generator 13 connected to the enable signal generator 20. Based on the enable signal LE, the one-shot pulse generator 13 produces an output signal φ5, which is input to the gate of a P channel MOS transistor Tr45. The transistor Tr45 has a drain connected to the drain of the transistor Tr41 and a source connected to the low potential power supply Vss via a capacitor C2. The high potential end $TC_H$ of the capacitor C2 is connected to the drain of a P channel MOS transistor Tr46. This transistor Tr46 has a source connected to the power supply Vcc and a gate which receives the control signal /RAS via an inverter 12f.

Figure 17:
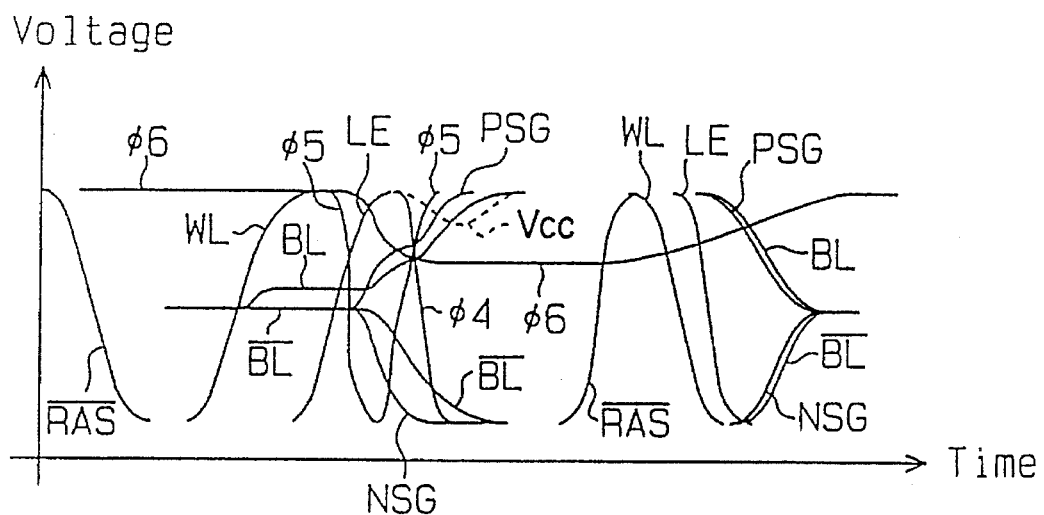
FIG. 17 is a timing waveform chart illustrating the operation of the eighth embodiment.
Figure 18:
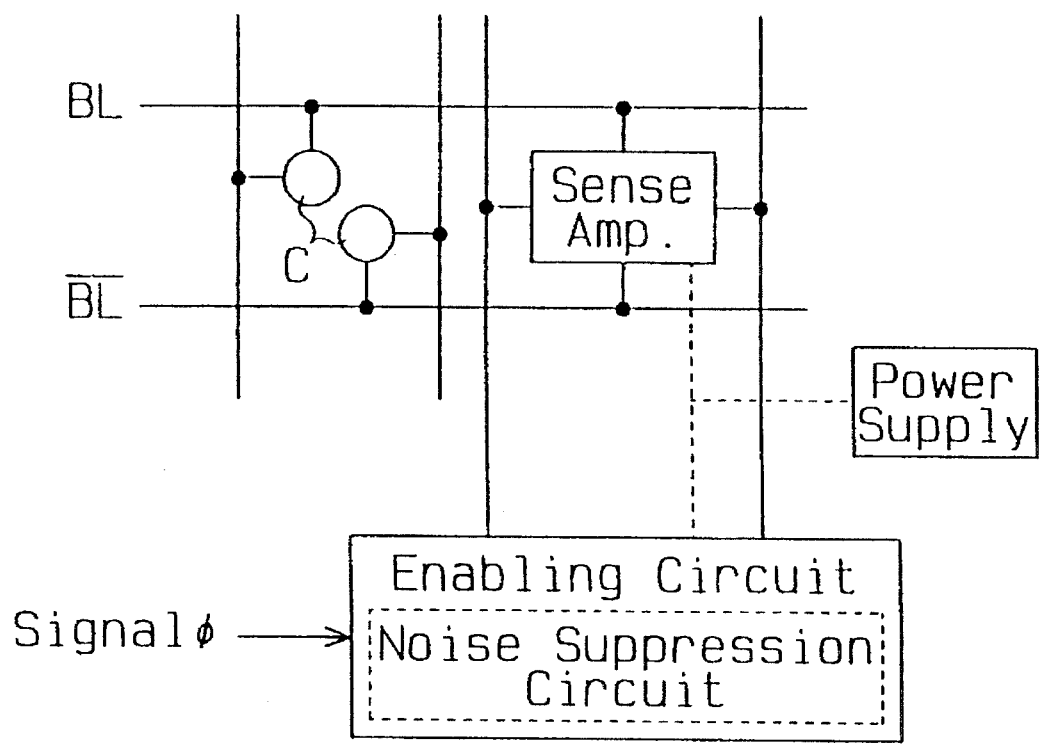
FIG. 18 is a schematic illustration showing essential parts of the present invention embodied as the first through eighth embodiments.

The reading operation of the DRAM according to this embodiment will be described below with reference to FIG. 17. Prior to reading operation, when the control signal /RAS is high, the transistor Tr46 turns on. The potential level, φ6, at the high potential end $TC_H$ of the capacitor C2 equals the level of the supply voltage Vcc. When the control signal /RAS falls low, the transistor Tr46 turns off. When the associated word line WL is selected, a slight potential difference occurs between the bit lines BL and /BL. Under this condition, when the sense amplifier enable signal LE rises high, the transistor Tr42 turns on, causing the low potential supply voltage NSG of the sense amplifier 11 to fall to the supply voltage level Vss. Further, when the output signal φ5 of the one-shot pulse generator 13 temporarily falls and turns on the transistor Tr46, the high potential supply voltage PSG enables the amplifier 11 at a level of the power supply Vcc based on the potential level φ6 at the potential end $TC_H$. At this time, the operation of the sense amplifier 11 causes the level φ6 of the potential end $TC_H$ to fall.

When the output signal φ5 of the one-shot pulse generator 13 rises switching the transistor Tr45 off, the output signal φ4 of the inverters 12e falls to turn on the transistor Tr41. As a result, the potential of the power supply Vcc is kept at the high potential supply voltage PSG supplied to the sense amplifier 11, allowing the amplifiers 11 to be maintained in an active state, increasing the potential difference between the bit lines BL and /BL.

When the control signal /RAS next rises high, the transistor Tr46 turns on and the level φ6 at the potential end $TC_H$ rises to the level of the power supply Vcc. When the word line WL goes low to terminate the selection of the memory cell C, and when the sense amplifier enable signal LE falls low, the levels of the high and low potential supply voltages PSG and NSG of the sense amplifier 11 equalize. This disables the sense amplifier 11 and resets the potentials of the bit lines BL and /BL.

According to the DRAM of this embodiment, as apparent from the above, when the sense amplifier enable signal LE goes high enabling the sense amplifier 11, the high potential supply voltage PSG of the sense amplifier 11 first settles at the potential level φ6, the high potential end $TC_H$ of the capacitor C2, so that charges are supplied to the sense amplifier 11 from the capacitor C2. Then, the high potential voltage supply PSG, controlled by the power supply Vcc, allows the power supply Vcc to supply the sense amplifier 11. Accordingly, even if many sense amplifiers 11 are simultaneously enabled in self-refresh or read modes, it is possible to prevent the over supply of power from power supply Vcc to each of the sense amplifiers 11. This effectively suppresses the occurrence of power supply noise caused when the potential level of the power supply Vss falls.

The capacitor C2 is charged in synchronism with the rise of the control signal /RAS, after the sense amplifier 11 increases the difference in potential between lines BL and BL. It is thus possible to reduce variations in the voltage level of power supply Vcc caused by the charging of the capacitor C2.

Although only several embodiments of the present invention have been described herein, it should be apparent to those skilled in the art that the present invention may be embodied in many other specific forms without departing from the spirit or scope of the invention. Particularly, it should be understood that the seventh embodiment and the eighth embodiment may be combined allowing the sense amplifier enabling circuit to suppress both power supply noise caused by the falling of the level of the high potential power supply Vcc and power supply noise caused by the rising of the level of the low potential power supply Vss.

The present examples and embodiments are to be considered as illustrative and not restrictive and the invention is not to be limited to the details given herein, but may be modified within the scope of the appended claims.

What is claimed is:

1. A semiconductor memory device, supplied with power from a power supply, comprising:

memory cells for storing data;

a sense amplifier coupled to said memory cells via a pair of bit lines;

an enabling circuit responsive to an enable signal for enabling said sense amplifier to write cell data, read on said pair of bit lines, into said memory cell and to rewrite the written cell data to the memory cells during a self-refresh operation, said enabling circuit being provided between the sense amplifier and the power supply; and a noise suppression circuit incorporated in said enabling circuit, for suppressing rapid changes in the flow of current between said power supply and said sense amplifier in order to minimize power supply related noise.

2. The memory device according to claim 1, wherein the memory device is a dynamic random access semiconductor memory device.

3. A semiconductor memory device, supplied with power from a power supply, comprising:

memory cells for storing data;

a sense amplifier coupled to said memory cells via a pair of bit lines;

an enabling circuit responsive to an enable signal for enabling said sense amplifier to write cell data, read on said pair of bit lines, into said memory cell and to rewrite the written cell data to the memory cells during a self-refresh operation; and a noise suppression circuit incorporated in said enabling circuit, for suppressing rapid changes in the flow of current between said power supply and said sense amplifier in order to minimize power supply related noise, wherein said noise suppression circuit includes:
- a capacitor to be charged to a supply voltage, prior to reception of said enable signal by said enabling circuit; and
- a switching circuit for connecting said sense amplifier to said capacitor for a predetermined period of time after reception of the enable signal, and for connecting said sense amplifier to said power supply after the elapse of said predetermined time.

4. The memory device according to claim 3, wherein said switching circuit connects said capacitor, disconnected from said sense amplifier, to said power supply after the connection between said sense amplifier and said power supply, in order to initialize the capacitor.

5. The memory device according to claim 3, wherein said switching circuit includes:
- a one-shot pulse generator for generating a control pulse based on said enable signal to connect said sense amplifier to said capacitor only during a predetermined period of time; and
- a delay circuit for delaying said enable signal in order to connect said sense amplifier to said power supply, following said predetermined period of time during which sense amplifier is connected to said capacitor.

* * * * *